United States Patent [19]
Tanaka et al.

[11] Patent Number: 4,663,833
[45] Date of Patent: May 12, 1987

[54] METHOD FOR MANUFACTURING IC PLASTIC PACKAGE WITH WINDOW

[75] Inventors: Seietsu Tanaka; Tomiichi Shibata, both of Tokyo, Japan

[73] Assignee: Oki Electric Industry Co. Ltd., Tokyo, Japan

[21] Appl. No.: 731,952

[22] Filed: May 8, 1985

[30] Foreign Application Priority Data

May 14, 1984 [JP] Japan .................. 59-94569

[51] Int. Cl.⁴ ...................... H01L 23/28; H01L 23/32
[52] U.S. Cl. ........................................ 29/588; 357/72; 264/272.17
[58] Field of Search ............................ 29/588; 357/72; 264/272.14, 272.15, 272.17, 275, 278

[56] References Cited
U.S. PATENT DOCUMENTS 3,611,061 10/1971 Segerson .......................... 317/234 R
3,981,074 9/1976 Yamamoto et al. .................. 29/588

FOREIGN PATENT DOCUMENTS 138845 10/1980 Japan ..................... 29/588
57-42152 9/1982 Japan ..................... 29/588
59-96750 6/1984 Japan ..................... 29/588

OTHER PUBLICATIONS

Lazlo, Jr., "The Japanese Semiconductor Industry, Robust Industry Conditions to Persist through 1984", Hambrecht and Quist Inc., 1/84.

Primary Examiner—Brian E. Hearn
Assistant Examiner—John T. Callahan
Attorney, Agent, or Firm—Wenderoth, Lind & Ponack

[57] ABSTRACT

A method for manufacturing a plastic IC package with a light receiving window, for a semiconductor IC device, which includes the steps of preparing a lead frame supporting member provided, in a central portion of a main surface thereof, with a groove for receiving a liquid molding resin therein, disposing an IC lead frame on the lead frame supporting member within a mold, and molding a plastic package so as to enclose the IC lead frame and the lead frame supporting member therein and to form an opening in the plastic package at a portion corresponding to the IC chip mounting area of the IC lead frame. An IC chip is then mounted on the IC chip mounted area and interconnected by wires with the leads of the IC lead frame. Then a light transmitting window plate is adhesively fixed over the opening in the molded plastic package.

8 Claims, 9 Drawing Figures

METHOD FOR MANUFACTURING IC PLASTIC PACKAGE WITH WINDOW

BACKGROUND OF THE INVENTION

1. Field of the Invention

The present invention relates to a method for manufacturing an IC plastic package with a window.

2. Description of the Prior Art

In most semiconductor IC devices, the IC chip is sealed in a plastic package through resin-molding. The IC plastic package technology enables the mass production of IC devices and the automation of the IC device manufacturing process, and contributes quite effectively to the reduction of the cost of the IC device.

Such an IC plastic package is disclosed and described in detail, for example, in U.S. Pat. No. 3,611,061.

However, since a package for an IC chip having a light receiving surface, such as an EPROM or an image sensor, needs to be provided with a light receiving window, the plastic-molding technology could not have been applied to the manufacture of such an IC chip. Accordingly, it has been necessary to seal an IC chip having a light receiving surface in a ceramic package having a transparent window. However, the complex structure of the ceramic package with a window has been a significant impediment to the reduction of the manufacturing cost of the IC device.

Furthermore, a process for hermetically sealing a package body and a ceramic plate with a glass of a low melting point heated approximately at 450° C. approximately in ten minutes is indispensable to manufacturing a ceramic IC package. Therefore, aluminum wires are used instead of Au wires for wiring, to obviate disconnection resulting from the alloying reaction of metal wires with the aluminum pads provided on the surface of the chip.

However, the low efficiency of bonding work for aluminum wires, as compared with that for Au wires, has been disadvantageous from the viewpoint of mass production. Accordingly, the industry has been desiring a method for mass-producing plastic IC packages with a transparent window at a reduced cost without subjecting IC chips to any high-temperature heat treatment process.

SUMMARY OF THE INVENTION

Accordingly, it is an object of the present invention to provide a method for manufacturing a plastic IC package with a light receiving window.

It is another object of the present invention to provide a method for manufacturing a plastic IC package applicable to an EPROM IC device and to an image sensing IC device.

A method for manufacturing a plastic IC package with a light receiving window, according to the present invention, comprises:

preparing an IC lead frame having an IC chip mounting area, a plurality of leads and tie bars interconnecting the leads;

preparing a lead frame supporting member having a groove for introducing a liquid molding resin practically into the central portion of the main surface;

placing the lead frame on the lead frame supporting member with the IC chip mounting area of the lead frame located over the groove of the lead frame supporting member;

placing the lead frame and the lead frame supporting member in a mold so that the IC chip mounting area of the lead frame will not be covered with the molding resin;

pouring the liquid molding resin into the mold and solidifying the molding resin; and removing the molding having an opening exposing the IC chip mounting area of the lead frame from the mold.

Furthermore, a method for manufacturing a plastic IC package according to the present invention, comprises:

preparing an IC lead frame having an IC chip mounting area, a plurality of leads and tie bars interconnecting the leads, and a lead frame supporting member having a groove for introducing a liquid molding resin practically into the central portion of the main surface;

adhesively attaching the lead frame to the lead frame supporting member with an adhesive so that the IC chip mounting area of the lead frame is located over the groove of the lead frame supporting member;

placing a structure in process formed through the preceding steps in a mold so that the surface of the IC chip mounting area of the lead frame will not be coated with the liquid molding resin when the same is poured into the cavity of the mold;

pouring the liquid molding resin into the cavity of the mold and solidifying the same; and removing the molding having an opening exposing the IC chip mounting area of the lead frame from the mold.

The above and other objects, features and advantages of the present invention will become more apparent from the following detailed description thereof taken in conjunction with the accompanying drawings.

DETAILED DESCRIPTION OF THE PREFERRED EMBODIMENT

A method for manufacturing an IC plastic package, according to the present invention will be described hereinafter with reference to a preferred embodiment thereof shown in FIGS. 1 through 7.

Figure 1:
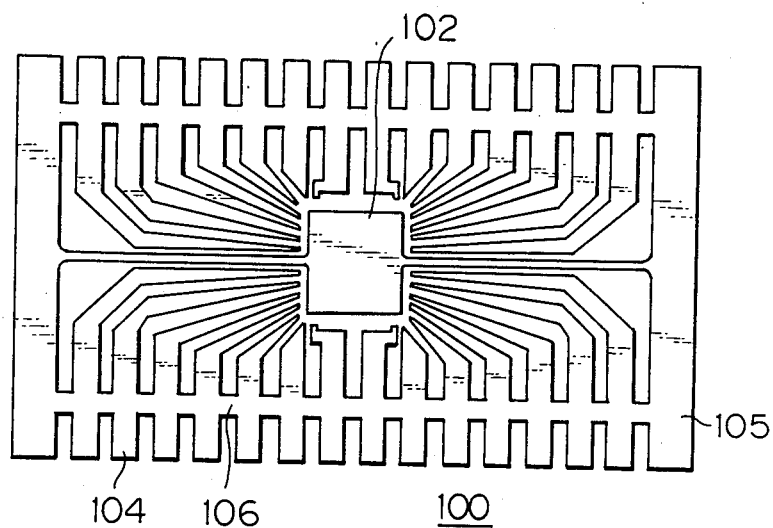
FIG. 1 is a plan view of an IC lead frame.
Figure 2A:
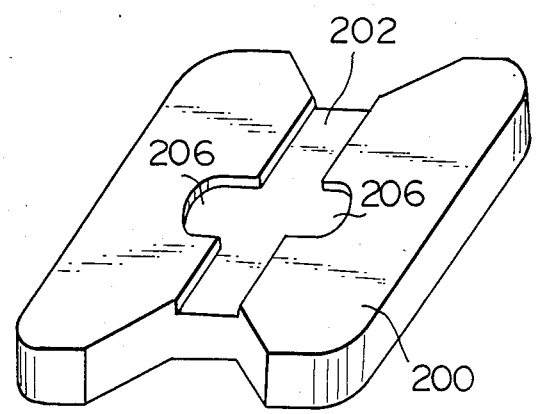
FIGS. 2A and 2B are a perspective view and a bottom plan view respectively of a lead frame supporting member.
Figure 2B:
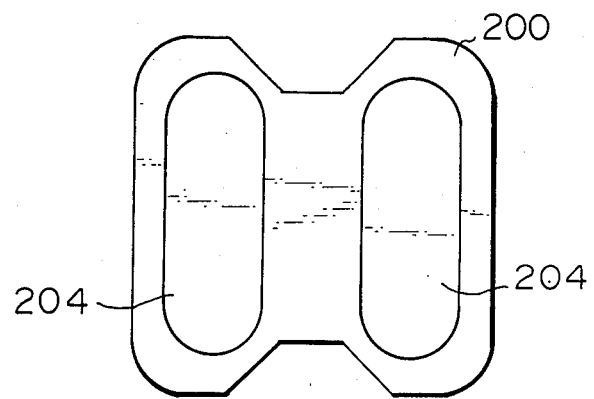

First, an IC lead frame 100 as shown in FIG. 1 and a lead frame supporting member 200 as shown in FIGS. 2A and 2B are prepared. The IC lead frame 100 is formed of an iron-nickel alloy and has a gold-plated IC chip mounting area 102, a plurality of leads 104, a frame members 105 and tie bars 106. The lead frame supporting member 200 is formed, for example, by molding epoxy resin, measures, for example, 10 mm×10 mm×1.5 mm, and is provided in the front side surface thereof with a groove 202 measuring 2 mm wide×approx. 0.5 mm deep and a basin 206 for receiving the molding resin. Recesses 204 each measuring, for example, 8 mm long×3 mm wide×0.3 mm deep are formed in the backside of the lead frame supporting member 200.

Generally, a mold lubricant is applied to the surface of the lead frame supporting member in use. Accordingly, it is desirable to clean the lead frame supporting member 200 with an organic solvent, such as trichloroethylene, before use.

Figure 3:
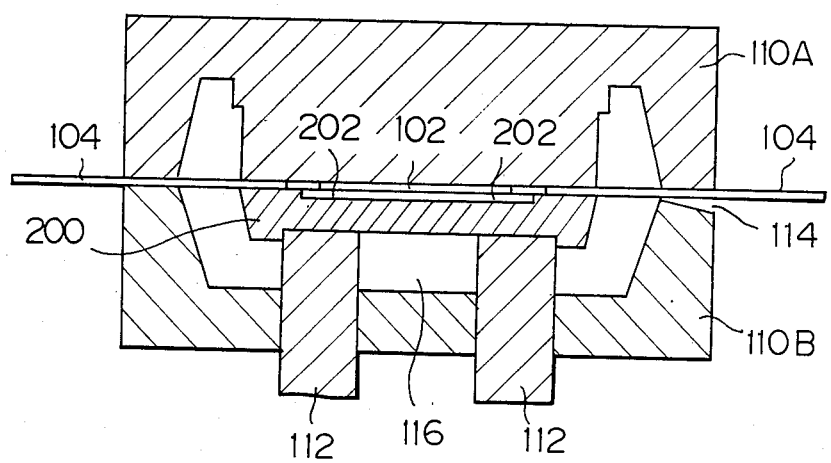
FIG. 3 is a sectional view showing a structure obtained during the process of the invention, consisting of a lead frame and a lead frame supporting member, as disposed within a mold.

Secondly, as shown in FIG. 3, the lead frame 100 and the lead frame supporting member 200 are disposed in a mold 110 so that the IC chip mounting area 102 of the lead frame 100 is aligned with the groove 202 of the lead frame supporting member 200. The front side surface of the lead frame 100 (facing away from the supporting member 200) is pressed against the inner surface of the molding 110 by means of positioning pins or protrusions 112 as shown in FIG. 3, to prevent a portion of the front surface of the lead frame 100 which is inside the opening in the molded plastic package to be formed, from being coated with the molding resin. The positioning pins 112 may serve also as ejecting pins for ejecting the molding from the mold. A molding resin, liquid epoxy resin in this case, is poured through a sprue 114 into the cavity 116 of the mold 110. The liquid epoxy resin flows also into the groove 202 and the basin 206 of the lead frame supporting member 200. The epoxy resin thus poured into the mold is heated, for example, at a temperature within the range of 160° to 180° C. for one to two minutes for polymerization and solidification.

Figure 4:
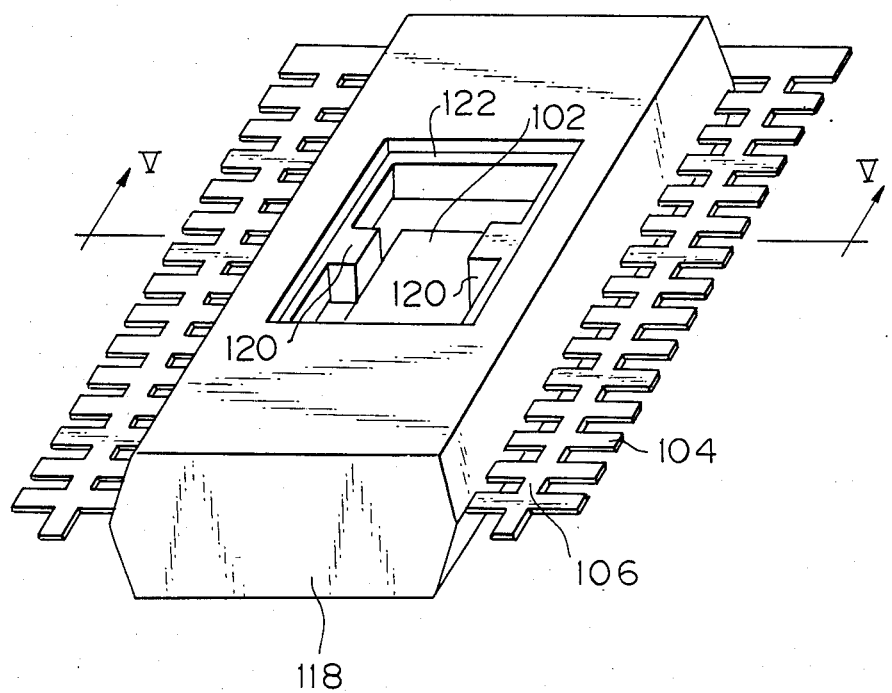
FIG. 4 is a perspective view of a molded plastic package.
Figure 5:
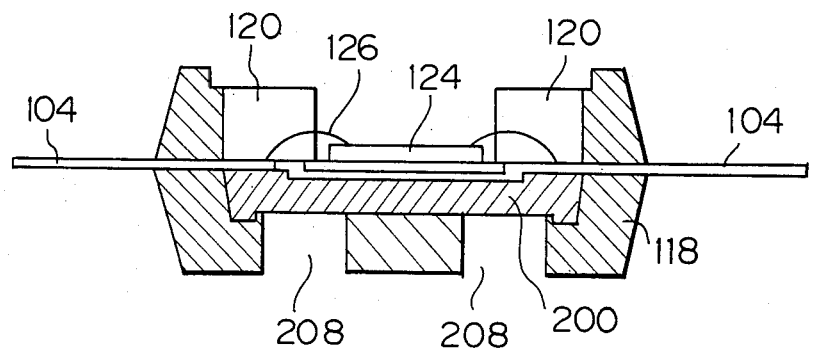
FIG. 5 is a sectional view taken along line V—V in FIG. 4 showing a plastic package mounted with an IC chip.
Figure 6:
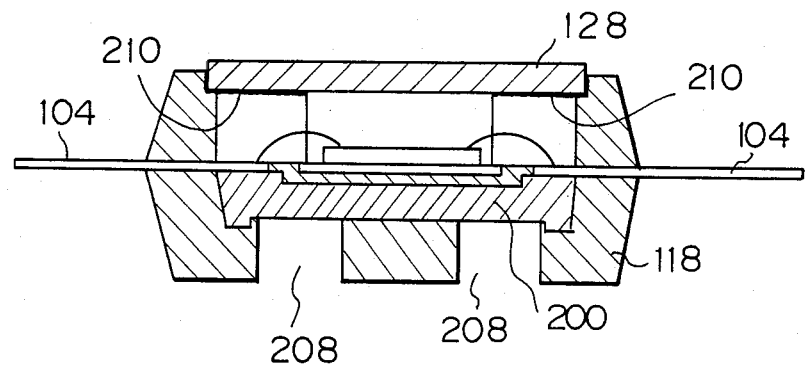
FIG. 6 is a sectional view of an IC plastic package fixedly provided with a transparent plate taken along the same line as line V—V in FIG. 4.

Thirdly, the thus molded plastic package 118 as shown in FIG. 4 is removed from the mold.

Generally, after being removed from the mold, the plastic package 118 is reheated in the atmosphere at a temperature within the range of 150° to 180° C. for three to five hours to complete the solidification.

In molding the plastic package 118, it is desirable to from reinforcements 120 as shown in FIG. 4 in the plastic package 118 to reinforce the side walls of the same. A step 122 is formed in the walls defining the opening of the plastic package 118 to fit a transparent plate in place on the plastic package.

A thin film of the molding resin accidentally formed over the IC chip mounting area of the lead frame can readily be removed by blasting high-pressure water containing alumina particles against the thin film of the molding resin.

Fourthly, an IC chip 124 including a FAMOS (Floating gate Avalanche MOS) transistor is die-bonded to the lead frame in the IC chip mounting area 102.

Fifthly, the pad electrodes of the IC chip 124 and the leads 104 of the lead frame are interconnected with gold or aluminum wires 126 bonded to the pad electrodes and the leads respectively.

Sixthly, a plate 128 made of an ultraviolet-transmissive material, for instance, is placed on the step 122 of the plastic package and is fixed hermetically with an epoxy adhesive 210. The thickness of the plate 128, for example, is a value within the range of 0.4 to 0.7 mm. Desirable materials for forming the plate 128 are quartz, transparent alumina, polypropylene resins and polyester resins.

Figure 7:
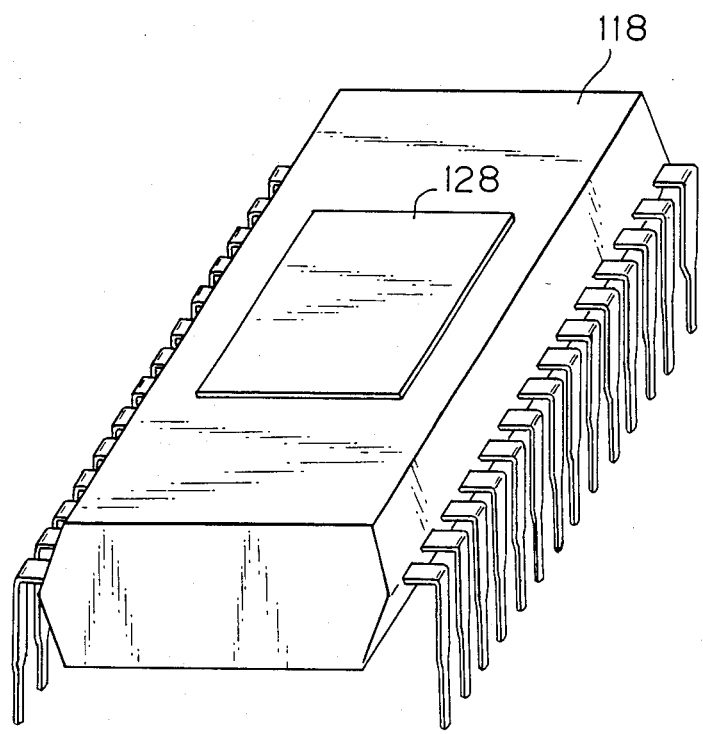
FIG. 7 is a perspective view showing an IC plastic package with a light receiving window, manufactured according to a method of the present invention.

Seventhly, as shown in FIG. 7, the frame members 105 and the tie bars 106 of the IC lead frame 100 are cut off, and then the leads 104 are bent at a right angle to finish a plastic IC package of the dual-in-line type having a light receiving window.

Figure 8:
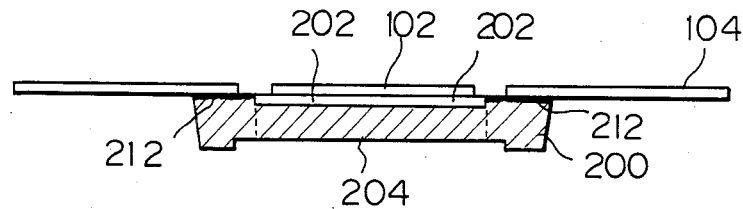
FIG. 8 is a sectional view of a structure formed by fixedly attaching an IC lead frame to a lead frame supporting member taken along the same line as line V—V in FIG. 4.

In a modification, an intermediate assembly formed by adhesively attaching an IC lead frame to a lead frame supporting member with an epoxy adhesive 212 as shown in FIG. 8 may be placed in a mold before molding a plastic package.

It is more preferable, from the viewpoint of preventing the leakage of moisture into the plastic IC package, to fill recesses 208 formed in the plastic package by the positioning pins with an epoxy resin. A leak test showed that the leak rate of a plastic IC package manufactured according to the present invention was approximately $1 \times 10^{-8}$ cc. atm/sec.

An EPROM device produced by the method of the present invention was subjected to an accelerated durability test of 85° C. test temperature, 85% humidity and roughly 192 hours test duration. Nothing abnormal was found in the test specimen after the accelerated durability test.

Employing a lead frame having rough surfaces is desirable with a view to form elongate passages over the surfaces of the lead frame along which moisture leaks in to the plastic IC package.

As is apparent from what has been described hereinbefore, according to the present invention, the package molding technique is applicable to the manufacture of a plastic IC package with a light receiving window. Therefore, the present invention readily enables the mass production of such plastic IC packages and reduces the manufacturing cost of the plastic IC package with a light receiving window remarkably. Furthermore, the elimination of a high-temperature heat treatment process reduces the possibility of disconnection failure and improves the yield rate of the semiconductor IC device manufacturing process.

What is claimed is:

1. A method of manufacturing a plastic molding IC device having a light receiving window comprising the steps of:
   (a) preparing an IC lead frame having an IC chip mounting area, a plurality of leads, and tie bars interconnecting the leads;
   (b) preparing an IC lead frame supporting member of epoxy resin having a groove formed in a front surface thereof to receive a liquid epoxy resin material;
   (c) placing the IC lead frame on the front surface of the IC lead frame supporting member such that a back surface of the IC mounting area covers the front groove in the IC lead frame supporting member;
   (d) adhesively attaching the IC lead frame supporting member to the back surface of the IC chip mounting area of the IC lead frame to form an intermediate assembly;
   (e) placing the intermediate assembly in a molding cavity of a mold so as to press the front surface of the IC lead frame supporting member against the lead frame with an inner protrusion of the mold;

(f) introducing liquid epoxy resin material into the molding cavity and so as to flow into the grooves in the IC lead frame supporting member;

(g) polymerizing and solidifying the liquid epoxy resin material to form a molded plastic package having an opening exposing the front surface of the IC chip mounting area of the IC lead frame;

(h) bonding an IC chip on the front surface of the IC chip mounting area of the IC lead frame;

(i) interconnecting pads of the IC chip and the leads of the IC lead frame with metallic wires, respectively; and (j) adhesively fixing a light transmitting window plate over the opening of the molded plastic package.

2. A method as in claim 1, wherein said step of adhesively fixing includes the step of adhesively fixing over the opening of the molded plastic package a light transmitting window plate formed of a material selected from the group of materials consisting of quartz, transparent alumina, polypropylene resin and polyester resin.

3. A method as in claim 1, wherein said steps of placing, introducing and polymerizing and solidifying include the step of forming the molded plastic package with a reinforced portion of epoxy resin extending from an inner side wall of the opening toward a middle portion of the IC chip mounting area.

4. A method as in claim 1, wherein said step of bonding includes the step of bonding one of an EPROM IC chip and an image sensing IC chip on the front surface of the IC chip mounting area of the IC lead frame.

5. A method of manufacturing a plastic molding IC device having a light receiving window comprising the steps of:

(a) preparing an IC lead frame having an IC chip mounting area, a plurality of leads and tie bars interconnecting the leads, the IC chip mounting area having a front surface and a back surface;

(b) preparing an IC lead frame supporting member of epoxy resin having a groove formed in a front surface thereof to store a liquid epoxy resin material;

(c) placing the IC lead frame and the IC lead frame supporting member in a molding cavity such that the front surface of the IC chip mounting area of the IC frame is protected from being coated with liquid epoxy resin material when liquid epoxy resin material is injected into the molding cavity, the back surface of the IC chip mounting area covering the groove of the IC lead frame supporting member;

(d) injecting liquid epoxy resin material into the molding cavity and so as to flow into the groove in the IC lead frame supporting member, without coating the front surface of the IC chip mounting area with the liquid epoxy resin material;

(e) polymerizing and solidifying the liquid epoxy resin material to form a molded plastic package having an opening exposing the front surface of the IC chip mounting area of the IC frame;

(f) placing an IC chip on the front surface of the IC chip mounting area;

(g) interconnecting pads of an IC chip and the leads of the IC lead frame with metallic wires, respectively; and (h) adhesively fixing a light transmitting window plate over the opening of the molded plastic package.

6. A method as in claim 5, wherein said step of adhesively fixing includes the step of adhesively fixing over the opening of the molded plastic package a light transmitting window plate formed of a material selected from the group of materials consisting of quartz, transparent alumina, polypropylene resin and polyester resin.

7. A method as in claim 5, wherein said steps of placing, introducing and polymerizing and solidifying include the step of forming the molded plastic package with a reinforced portion of epoxy resin extending from an inner side wall of the opening toward a middle portion of the IC chip mounting area.

8. A method as in claim 5, wherein said step of bonding includes the step of bonding one of an EPROM IC chip and an image sensing IC chip on the front surface of the IC chip mounting area of the IC lead frame.

* * * * *